(12) United States Patent
Adachi et al.

(10) Patent No.: US 7,706,919 B2
(45) Date of Patent: Apr. 27, 2010

(54) WAFER POSITION TEACHING METHOD AND TEACHING JIG

(75) Inventors: Masaru Adachi, Fukuoka (JP);
Mitsunori Kawabe, Fukuoka (JP);
Masaru Shigesada, Okayama (JP)

(73) Assignee: Kabushiki Kaisha Yaskawa Denki, Fukuoka (JP)

( * ) Notice: Subject to any disclaimer, the term of this patent is extended or adjusted under 35 U.S.C. 154(b) by 1115 days.

(21) Appl. No.: 10/488,694

(22) PCT Filed: Sep. 6, 2002

(86) PCT No.: PCT/JP02/09076

§ 371 (c)(1),
(2), (4) Date: Oct. 5, 2004

(87) PCT Pub. No.: WO03/022534

PCT Pub. Date: Mar. 20, 2003

(65) Prior Publication Data

US 2005/0034288 A1    Feb. 17, 2005

(30) Foreign Application Priority Data

Sep. 7, 2001   (JP) .............................. 2001-272354

(51) Int. Cl.
G05B 19/04 (2006.01)
G05B 19/18 (2006.01)

(52) U.S. Cl. ..................... 700/254; 700/245; 700/250; 700/255

(58) Field of Classification Search .................. 700/245, 700/246, 247, 248, 250, 251, 253, 254, 255, 700/257, 258, 264; 901/3, 30, 47
See application file for complete search history.

(56) References Cited

U.S. PATENT DOCUMENTS 4,986,729 A * 1/1991 Ohlenbusch ................ 414/787
(Continued)

FOREIGN PATENT DOCUMENTS

JP          63-196391 A       8/1988
(Continued)

OTHER PUBLICATIONS

Japanese Office Action dated Sep. 2, 2008.

*Primary Examiner*—Khoi Tran
*Assistant Examiner*—Bhavesh V Amin
(74) *Attorney, Agent, or Firm*—Sughrue Mion, PLLC

(57) ABSTRACT

An object is to provide a method for teaching the position of a semiconductor wafer automatically and accurately without relying on the sight of an operator as well as a teaching jig that is used for the above method.

To this end, in the invention, a teaching jig 11 is detected by a first transmission-type sensor 6 that is provided at the tips of a wafer gripping portion 5 of a robot. The teaching jig 11 is composed of a large disc portion 12 that is the same in outer diameter as a semiconductor wafer and a small disc portion 13 that is concentric with the large disc portion 12. The teaching jig 21 is detected by a second transmission-type sensor 18 that is provided on the wafer gripping portion 5. The second transmission-type sensor 18 is mounted on a sensor jig 15 so as to be detachable form the wafer gripping portion 5.

9 Claims, 13 Drawing Sheets

U.S. PATENT DOCUMENTS

| | | | |
|---|---|---|---|
| 5,400,638 A * | 3/1995 | Kim | 73/1.79 |
| 5,783,834 A * | 7/1998 | Shatas | 250/559.33 |
| 5,905,850 A * | 5/1999 | Kaveh | 700/259 |
| 6,323,616 B1 * | 11/2001 | Sagues et al. | 318/568.11 |
| 2002/0068992 A1 * | 6/2002 | Hine et al. | 700/229 |

FOREIGN PATENT DOCUMENTS

| | | |
|---|---|---|
| JP | 06-278064 A | 10/1994 |
| JP | 8141955 A | 6/1996 |
| JP | 11-163098 A | 6/1999 |
| JP | 11-347975 A | 12/1999 |
| JP | 2000-288968 A | 10/2000 |
| JP | 2001-210692 A | 8/2001 |
| KR | 1999-015953 A | 3/1999 |

* cited by examiner

WAFER POSITION TEACHING METHOD AND TEACHING JIG

TECHNICAL FIELD

The present invention relates to a method for teaching the position of a semiconductor wafer to a semiconductor wafer transport robot. The invention also relates to a teaching jig that is used for the above method.

BACKGROUND ART

In semiconductor manufacturing facilities, teaching reproduction type robots are frequently used for transport of a semiconductor wafer between a container and a processing apparatus or between processing apparatus. Work of teaching such a robot is such that an operator manually teaches a robot the position of a semiconductor wafer by manipulating a teaching pendant while looking at the semiconductor wafer that is placed inside a container or the like.

Other methods are also available, examples of which are a method of directly inputting the position of a semiconductor wafer on the basis of a system drawing of semiconductor manufacturing facilities (i.e., a drawing indicating positional relationships between robots, containers, etc.) and what is called off-line teaching in which the position of a semiconductor wafer is taught while a simulation is performed on a personal computer. However, even with those methods, it is necessary to directly teach a robot manually for each apparatus to correct for calibration errors of the robot itself, errors resulting from the accuracy of finishing of each apparatus, attachment errors, etc.

Various kinds of what is called auto-teaching have been proposed in which a distance sensor is attached to the hand of a robot and the robot is positioned automatically by detecting a subject being transported with the distance sensor (e.g., Japanese Patent No. 2,898,587 and JP-A-10-6262).

However, in conventional methods, in many cases it is difficult for an operator to approach a container or a processing device. It may be difficult or impossible for an operator to directly see a semiconductor wafer, in which case trial-and-error attempts need to be made repeatedly.

Since the quality of teaching work depends on the individual operator, there is a problem that variation occurs in the operation of a robot even in the same system.

In conventional auto-teaching methods, the position of a wafer is estimated on the basis of information detected by a distance sensor that operates in one direction. This results in a problem that the accuracy of the direction of a wafer is not satisfactory though the distance between a wafer and a robot can be determined with relatively high accuracy.

Conventional teaching jigs are composed of a large disc portion and a small disc portion and hence are thick, which leads to a problem that the installation space is restricted in height.

DISCLOSURE OF THE INVENTION

An object of the present invention is therefore to provide a method for teaching the position of a semiconductor wafer automatically and accurately without relying on the sight of an operator. Another object of the invention is to provide a teaching jig that is used for the above method.

To solve the above problems, the invention of claim 1 provides a method for teaching a position of a semiconductor wafer to a robot for transporting the semiconductor wafer between a container and a processing apparatus or between processing apparatus, wherein a teaching jig is placed at a position of the container or the processing apparatus where the semiconductor wafer is to be placed, and the teaching jig is detected by a transmission-type sensor that is provided at tips of a hand of the robot. According to the invention of claim 2, a pedestal of the processing apparatus on which the semiconductor wafer is to be mounted is detected by the transmission-type sensor. According to the invention of claim 3, detection of the teaching jig or the pedestal is performed three times or more and a position of the semiconductor wafer is determined on the basis of results of the detection by a least-squares method. According to the invention of claim 4, a teaching jig is formed by a large disc portion that is the same in outer diameter as the semiconductor wafer and a small disc portion that is concentric with the large disc portion. According to the invention of claim 5, a pin is provided approximately at a center axis position of the teaching jig and a second transmission-type sensor is provided on the hand, and the wafer position teaching method comprises a first step of determining a height of the teaching jig by detecting an outer circumference of the teaching jig with the first transmission-type jig; a second step of determining a position of the pin by detecting the pin with the first transmission-type sensor; and a third step of determining a position of the pin by detecting the pin with the second transmission-type sensor by causing the second transmission-type sensor to approach the pin on the basis of the position of the pin determined by the second step. According to the invention of claim 6, the second transmission-type sensor is mounted on a sensor jig so as to be detachable from the hand. According to the invention of claim 7, the second transmission-type sensor is disposed approximately at the center of a semiconductor wafer mounting portion of the hand. According to the invention of claim 8, an optical axis of the second transmission-type sensor is set approximately perpendicular to an optical axis of the first transmission-type sensor. According to the invention of claim 9, the sensor jig is formed with a cut for preventing interference with the optical axis of the first transmission-type sensor.

BEST MODE FOR CARRYING OUT THE INVENTION

Figure 1:
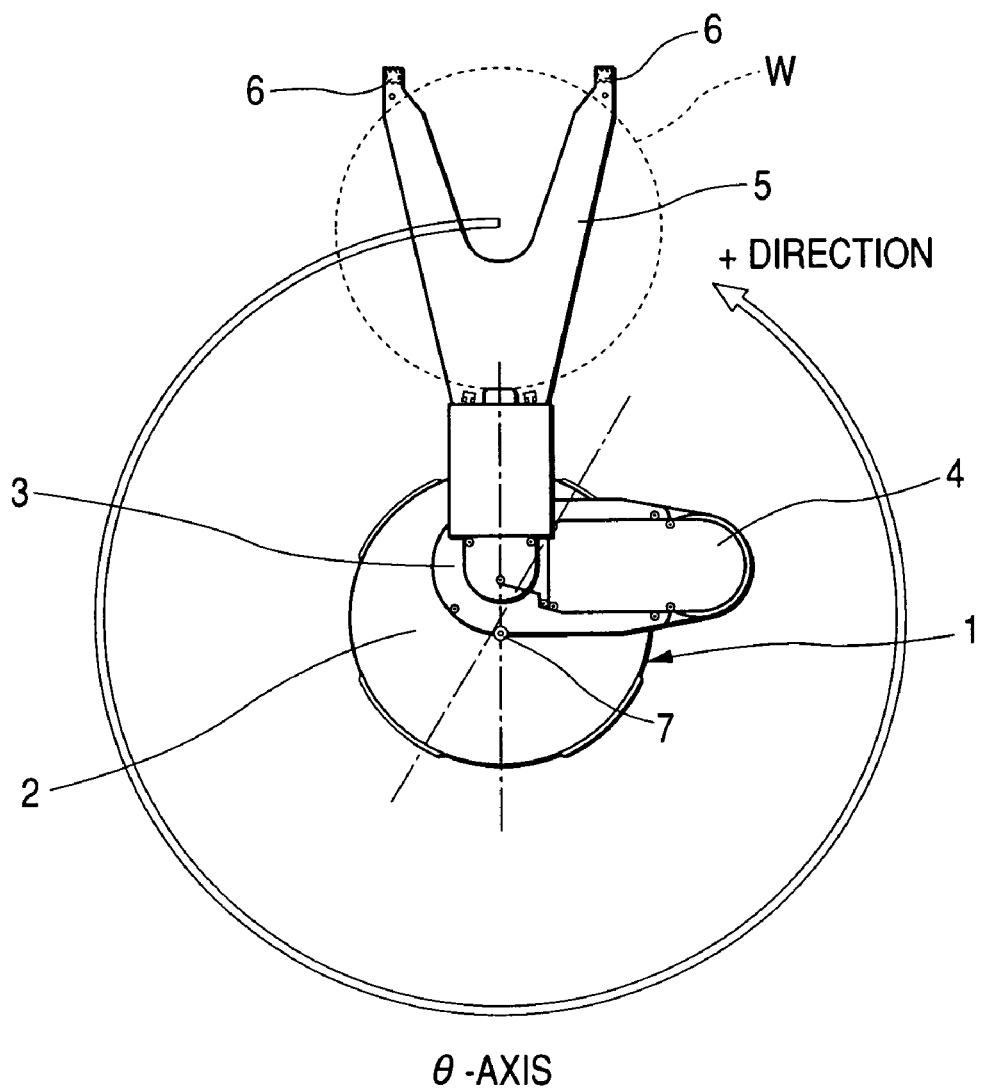
FIG. 1 is a plan view of a robot that is used in practicing the present invention.
Figure 2:
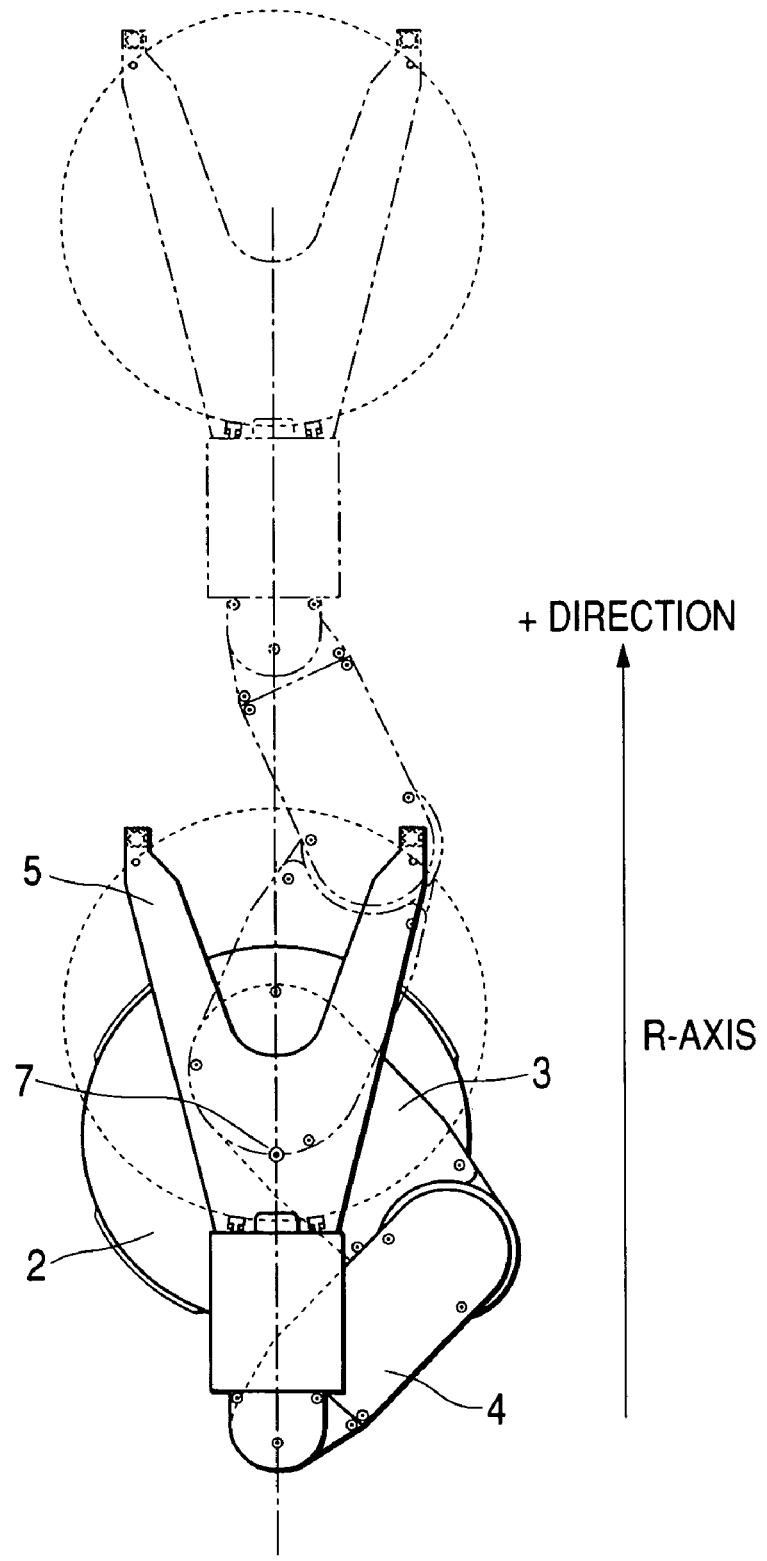
FIG. 2 is another plan view of the robot.
Figure 3:
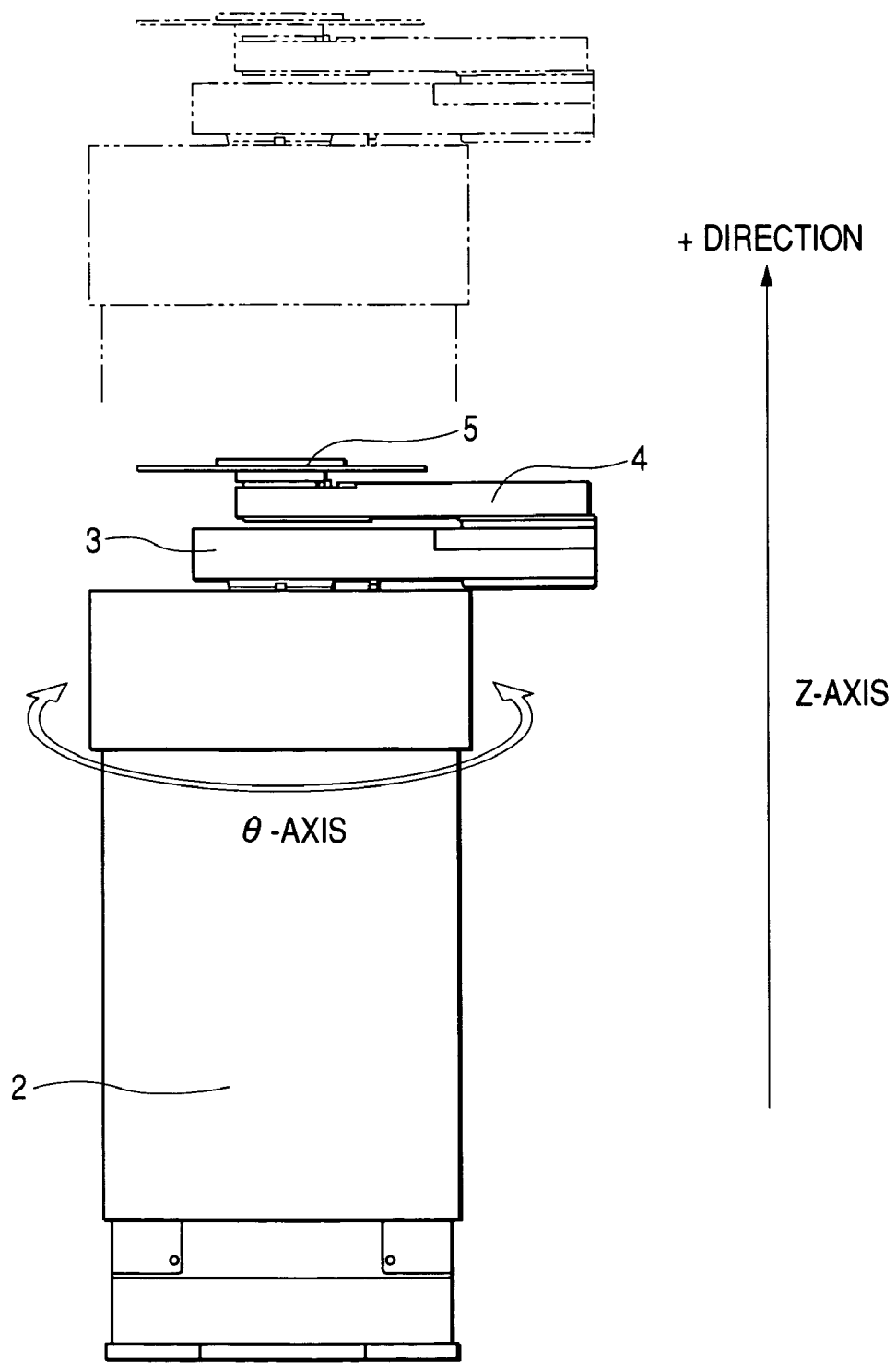
FIG. 3 is a side view of the robot.

An embodiment of the present invention will be hereinafter described with reference to the drawings. FIGS. 1 and 2 are plan views of a robot according to the embodiment of the invention. FIG. 3 is its side view.

In these figures, reference numeral 1 denotes a horizontal multi-joint robot for semiconductor wafer transport and character W denotes a semiconductor wafer as a subject to be transported by the robot 1. The robot 1 is equipped with a first arm 3 that is swung in a horizontal plane about a center axis 7 of a cylindrical prop 2 that can be elevated and lowered, a second arm 4 that is attached to the tip of the first arm 3 so as to be able to swing in a horizontal plane, and a wafer gripping portion 5 that is attached to the tip of the second arm 4 so as to be able to swing in a horizontal plane. The wafer gripping portion 5 a Y-shaped hand on which the semiconductor wafer W can be mounted. The wafer gripping portion 5 has a first transmission-type sensor 6 at the tips of the Y shape.

As shown in the figures, the robot 1 has three degrees of freedom: a θ-axis operation (circling) in which the first arm 3 is swung about the center axis 7 of the prop 2 while the angles between the first arm 3, the second arm 4, and the wafer gripping portion 5 are maintained; an R-axis operation (expansion/contraction) in which the wafer gripping portion 5 is advanced or retreated in a radial direction of the prop 2; and a Z-axis operation (elevation/lowering) in which the prop 2 is elevated or lowered.

The plus direction of the θ-axis is set to the counterclockwise direction (see FIG. 1), the plus direction of the R-axis is set to the direction in which the wafer gripping portion 5 goes away from the prop 2 (see FIG. 2), and the plus direction of the Z-axis is set to the direction in which the prop 2 is elevated (see FIG. 3).

Figure 4:
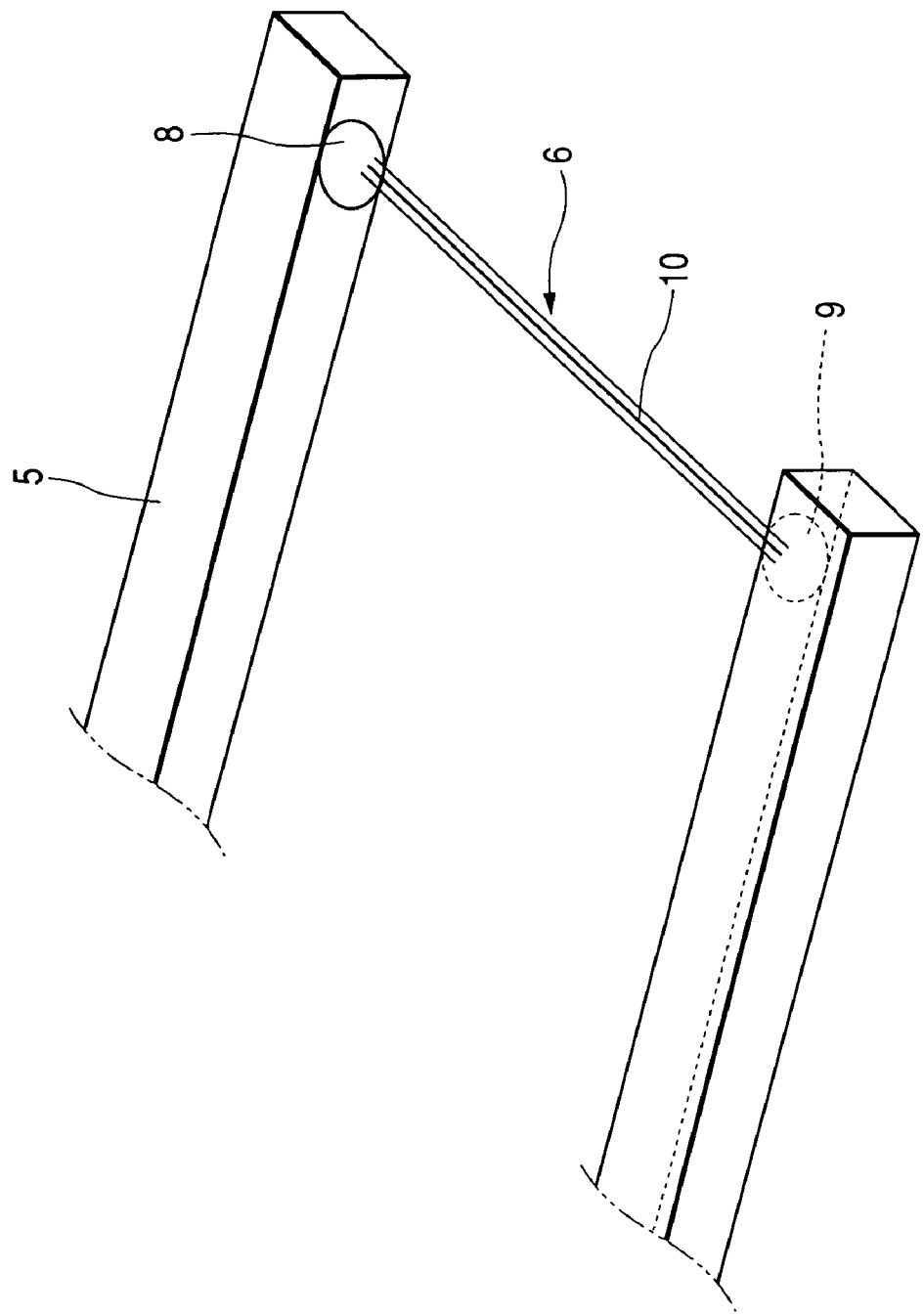
FIG. 4 illustrates a transmission-type sensor according to a first embodiment of the invention.

FIG. 4 illustrates a transmission-type sensor according to the embodiment of the invention. In the figure, reference numeral 8 denotes a light-emitting portion that is attached to one end of the Y-shaped wafer gripping portion 5 and numeral 9 denotes a light-receiving portion that is attached to the other end so as to be opposed to the light-emitting portion 8. The light-emitting portion 8 and the light receiving portion 9 constitute the first transmission-type sensor 6. Reference numeral 10 denotes an optical axis that extends from the light-emitting portion 8 to the light-receiving portion 9. The first transmission-type sensor 6 can detect an object that intersects the optical axis 10.

Figure 5:
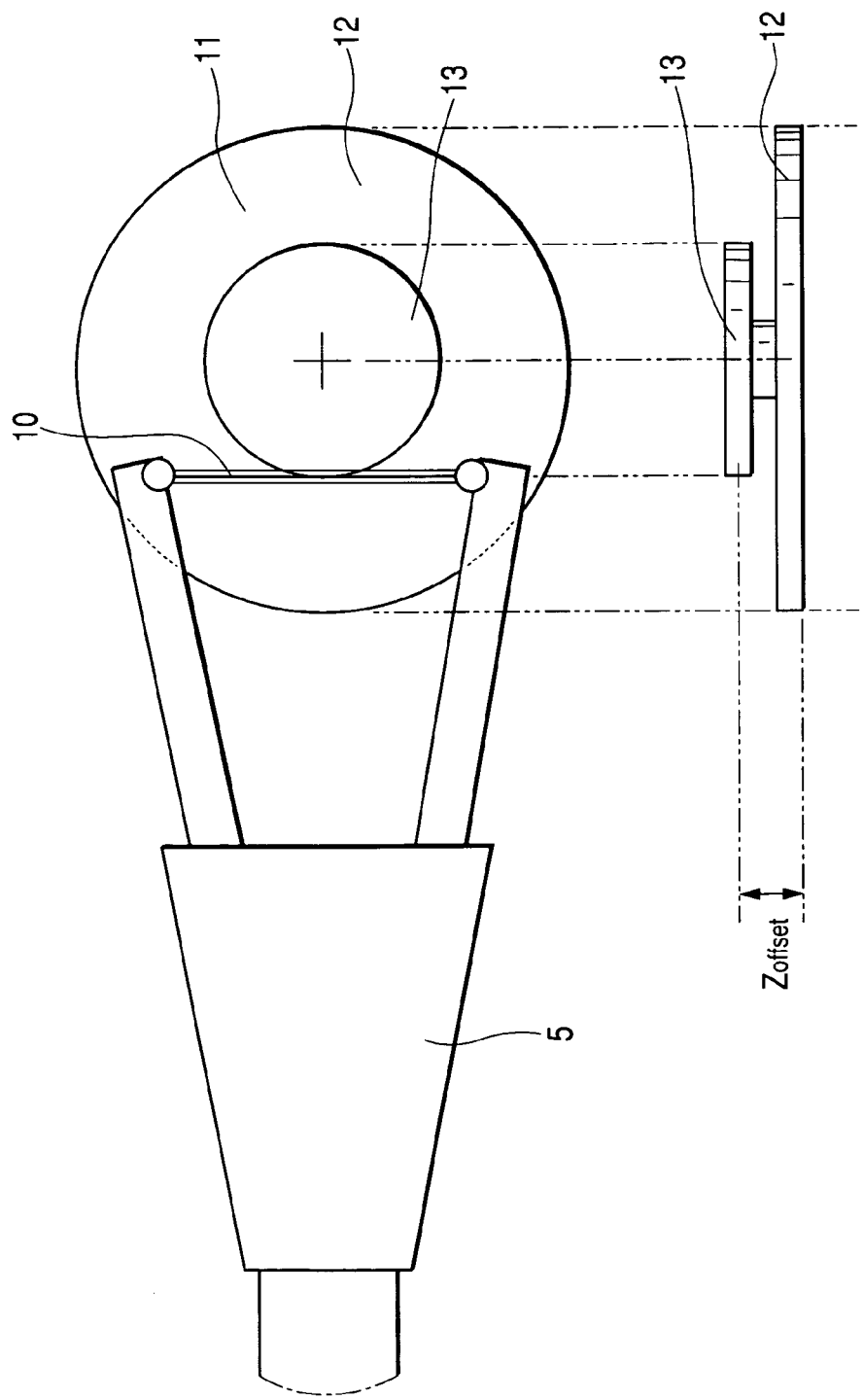
FIGS. 5-7 illustrate a wafer position teaching method according to the invention.
Figure 6:
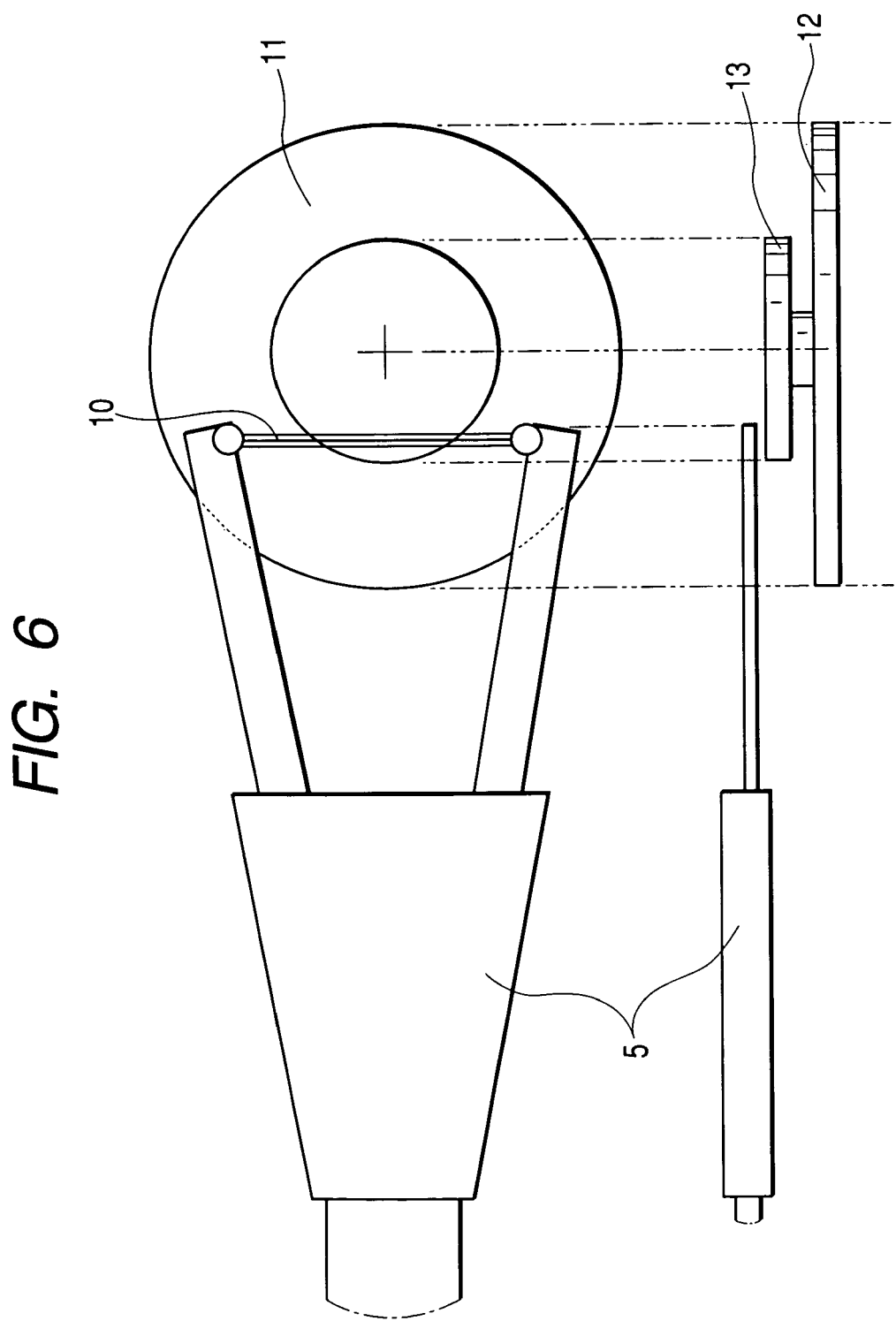

FIGS. 5 and 6 illustrate a wafer position teaching method according to the embodiment of the invention. In these figures, reference numeral 11 denotes a teaching jig in which a large disc portion 12 and a small disc portion 13 are laid one on the other concentrically in the vertical direction and combined together. The large disc portion 12 is the same in diameter as a real semiconductor wafer, and can be placed at a position of a container or the like where a semiconductor wafer is to be placed. Since the relative positional relationship between the large disc portion 12 and the small disc portion 13 is measured in advance, the position of the large disc portion 12 can be recognized by recognizing the position of the small disc portion 13.

The thickness of the large disc portion 12 is about 2 mm and is greater that that (0.7 mm) of the real semiconductor wafer, and this is determined from strength-related restrictions. It goes without saying that it is desirable that the thickness of the large disc portion 12 be the same as that of the real semiconductor wafer.

Next, the procedure of the wafer position teaching method will be described.

(Step 1) The teaching jig 11 is placed at a position of a container or the like where a semiconductor wafer is to be placed. Since the large disc portion 12 is completely the same in outer diameter as the real semiconductor wafer, the large disc portion 12 is positioned correctly by positioning guides or the like of the container or the like.

(Step 2) As a result of a manipulation by an operator, as shown in FIG. 6, the wafer gripping portion 5 is moved to above the small disc portion 13.

(Step 3) The wafer gripping portion 5 is lowered, and the top surface of the small disc portion 13 is detected by the first transmission-type sensor 6. A Z-axis coordinate Z1 of the robot 1 in this state is recorded. The wafer gripping portion 5 is further lowered, and the bottom surface of the small disc portion 13 is detected by the first transmission-type sensor 6. A Z-axis coordinate Z2 of the robot 1 in this state is recorded.

(Step 4) The Z-axis coordinate of the robot 1 is set at (Z1+Z2)/2; that is, the height of the wafer gripping portion 5 is set at the center of the top surface and the bottom surface of the small disc portion 13.

(Step 5) An R-axis operation is performed so that the arms are contracted to such an extent that the first transmission-type sensor 6 comes not to detect the small disc portion 13.

(Step 6) A θ-axis operation is performed so as to change the direction the wafer gripping portion 5 points to. Then, an R-axis operation is performed so that the wafer gripping portion 5 approaches the small disc portion 13 slowly. And θ-axis and R-axis coordinates that are obtained when: the first transmission-type sensor 6 first detects the small disc portion 13 (i.e., the optical axis 10 comes into contact with the circumferential surface of the small disc portion 13) are recorded.

(Step 7) Steps 6 and 7 are executed repeatedly. That is, the wafer gripping portion 5 is caused to approach the small disc portion 13 in different directions. Plural sets of θ-axis and R-axis coordinates are obtained when the optical axis 10 comes into contact with the circumferential surface of the small disc portion 13. The position of the center of the small disc portion 13 is determined on the basis of these values and recorded.

The position of the small disc portion 13 is determined in the above manner. Since the relative positional relationship between the small disc portion 13 and the large disc portion 12 is measured in advance, the position of the large disc portion 13, that is, the position of a semiconductor wafer to be mounted on the container or the like, can be determined by shifting the position of the small disc portion 13 by a length of the positional relationship.

If the operations of steps 2 to 7 are programmed in advance, the teaching of the position of the semiconductor wafer can be performed automatically without any manipulations by an operator.

Where the processing apparatus to teach is an apparatus such as a pre-aligner for mounting a semiconductor wafer on a disc-shaped pedestal, it is possible to teach the apparatus the position of the semiconductor wafer by executing steps 1 to 7 on the pedestal instead of the small disc portion 13 of the teaching jig 11.

Figure 7:
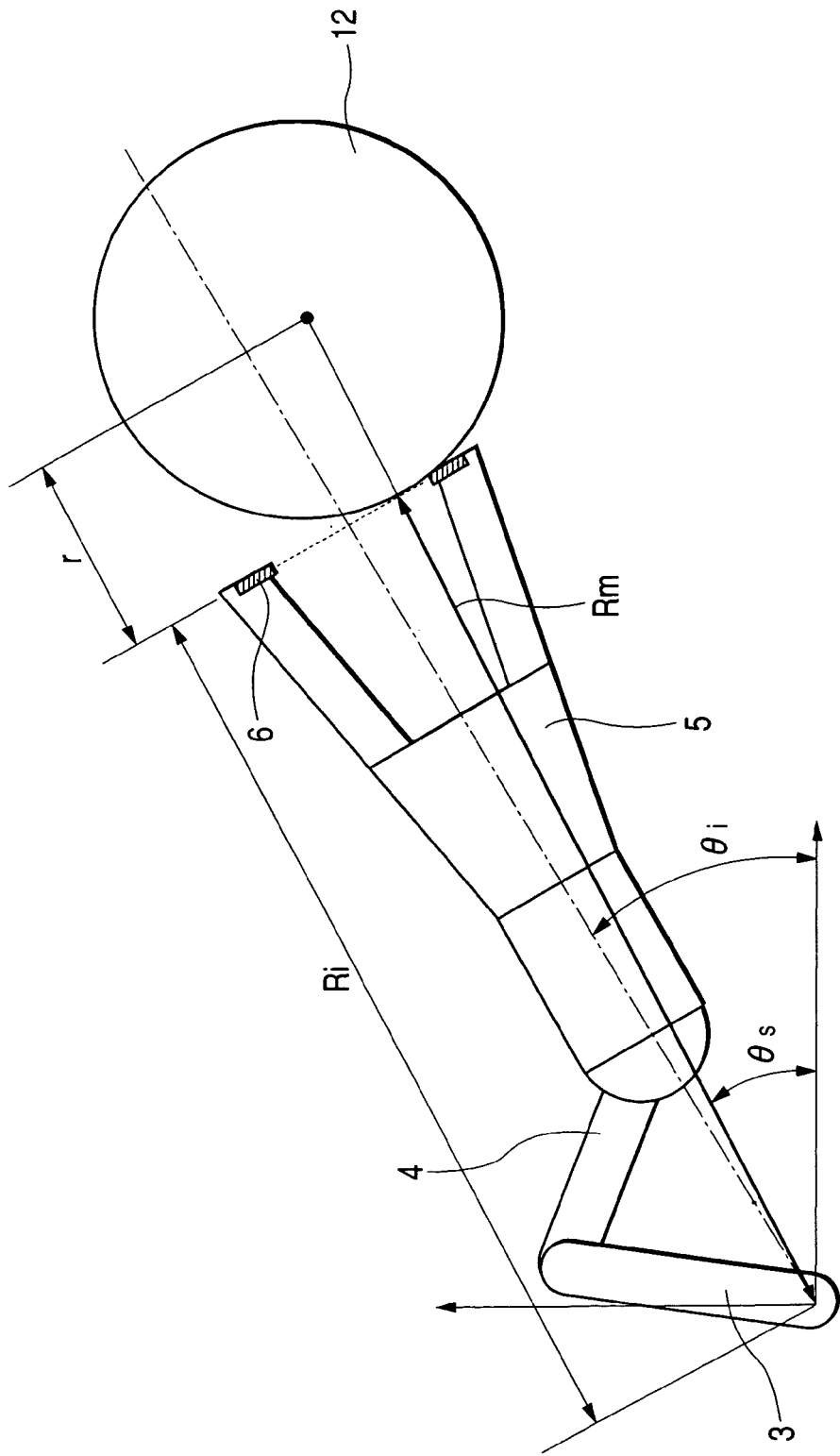

Next, the procedure of calculations for determining center coordinates (θs, Rs) of the small disc portion 13 at steps 2 to 7 will be described in detail. FIG. 7 illustrates a state that the optical axis 10 is in contact with the circumferential surface of the small disc portion 13. Parameters θi and Ri represent θ-axis and R-axis coordinates of the robot 1 in a state that the optical axis 10 of the first transmission-type sensor 6 is in contact with the circumferential surface of the small disc portion 13. The following equation holds:

$$Ri+r=(Rm+r)*\cos(\theta i-\theta s) \tag{1}$$

where Rm represents a distance between the contact point of the optical axis 10 and the circumferential surface of the small disc portion 13 and the rotation center of the first arm 3, and r represents the radius of the small disc portion 13.

Since Rs=Rm+r, $$Ri+r=Rs*\cos(\theta i-\theta s) \quad (2)$$

Modifying Equation (2), we obtain $$Ri+r=Rs*\cos\theta s*\cos\theta i+Rs*\sin\theta s*\sin\theta i \quad (3)$$

Substituting A=Rs*cos θs and B=Rs*sin θs into Equation (3), we obtain the following equation:

$$Ri+r=A*\cos\theta i+B*\sin\theta i \quad (4)$$

In this state, as described above for step 7, measurements are performed repeatedly while the direction the wafer gripping portion 5 points to is changed. Three or more sets of θi and Ri values are obtained, and the coefficients A and B are determined by the least-squares method.

Once the coefficients A and B are determined, θs is given by $$\theta s=\tan^{-1}(B/A). \quad (5)$$

Since $\cos\theta s=A/\sqrt{(A^2+B^2)}$, Rs is given by $$Rs=\sqrt{(A^2+B^2)}. \quad (6)$$

Next, a second specific embodiment of the invention will be described.

Figure 8:
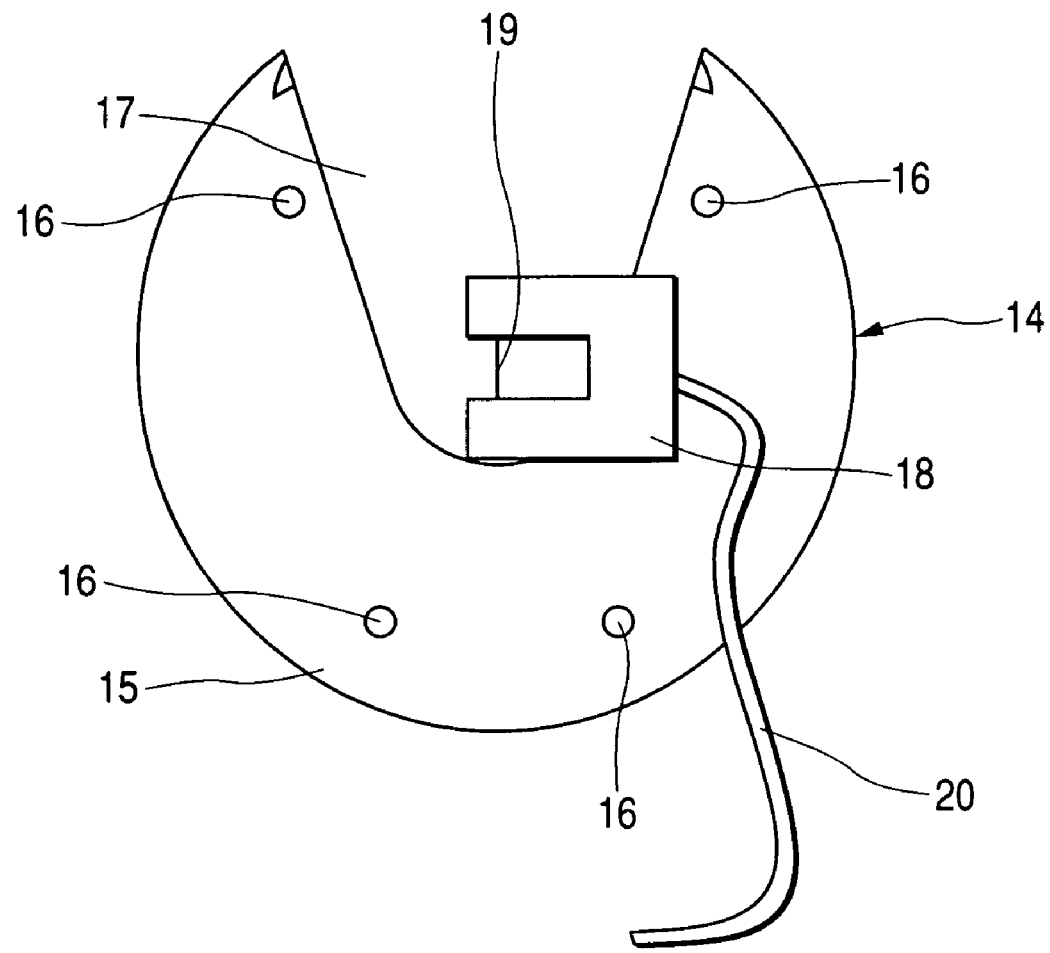
FIG. 8 and 9 are plan views of sensor jigs according to a second embodiment of the invention.

FIG. 8 is a plan view of a sensor jig 14 that is used in practicing the invention. Reference numeral 15 denotes a sensor mount plate, which is a flat plate obtained by forming a V-shaped cut in a disc and has four positioning holes 16. The positioning holes 16 are guide holes for correctly positioning the sensor jig 14 with respect to a wafer gripping portion (described later) via positioning pins of the: wafer gripping portion. The above-mentioned V-shaped cut is a sensing cut 17, which is to prevent the sensor mount plate 15 from interfering with the optical axis of a first transmission-type sensor of the wafer gripping portion when the sensor jig 14 is attached to the wafer gripping portion or from interfering with a pin of a teaching jig (described later). Reference numeral 18 denotes a second transmission-type sensor that is fixed to the sensor mount plate 15 at the center. Reference numeral 19, denotes the optical axis of the second transmission-type sensor 18. The second transmission-type sensor 18 is generally shaped like a bracket, and the width of its opening, that is, the length of the optical axis 19, is about 13 mm. Since the second transmission-type sensor 18 is fixed to the sensor mount plate 15 at the center, the second transmission-type sensor is located approximately at the center of a semiconductor mounting portion of a robot hand when the sensor jig 14 is attached to the robot hand. Reference numeral 20 denotes a sensor cable for sending a signal of the second transmission-type sensor to a robot controller (not shown).

Figure 9:
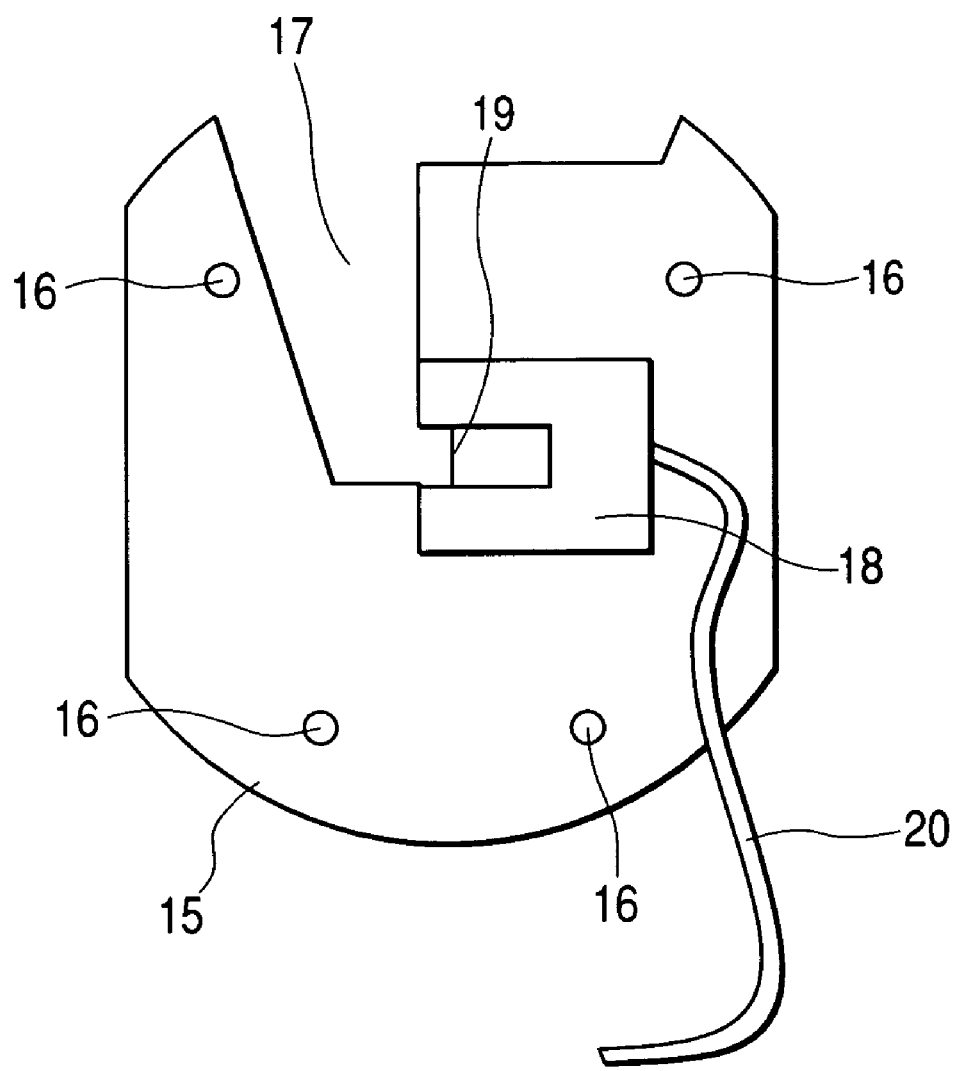

FIG. 9 is a plan view of another sensor jig 14. This sensor jig 14 is characterized in that the sensing cut 17 of the sensor mount plate 15 is shaped so as to have a minimum necessary size and that peripheral parts of the sensor mount plate 15 are cutaway. In the other points, the configuration and the functions of this sensor jig 14 are the same as those of the sensor jig 14 of FIG. 8.

Figure 10:
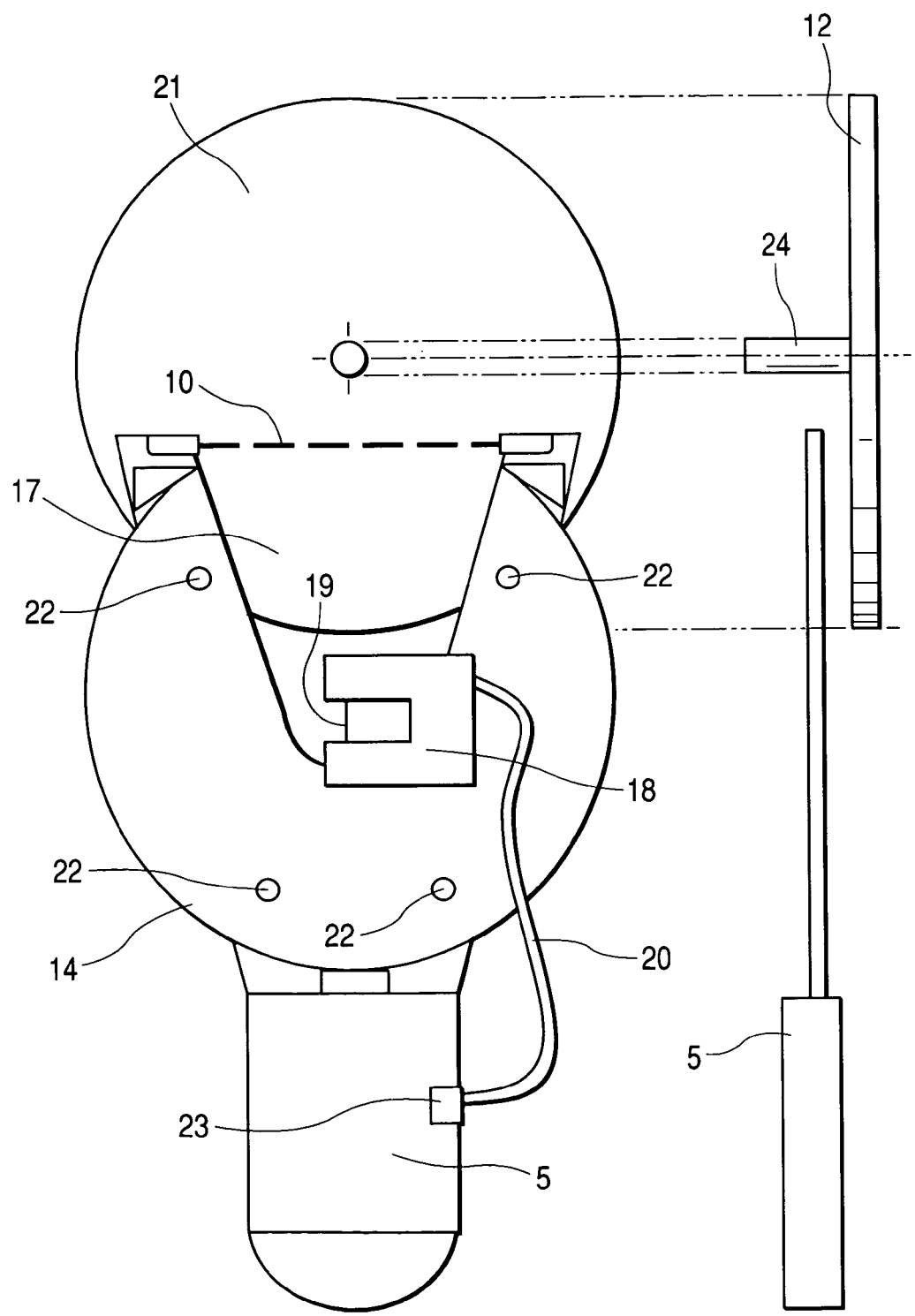
FIG. 10 illustrates a wafer position teaching method according to the second embodiment of the invention.

Next, a wafer position teaching method using the above sensing jig will be described, FIG. 10 illustrates a wafer position teaching method according to the second embodiment of the invention and shows a state that the sensing jig 114 is attached to a robot wafer gripping portion 5 and brought in close proximity to a teaching jig 21. The robot wafer gripping portion 5 is the same as the one described in the first embodiment except that the former is equipped with positioning pins 22 and a sensor cable connector 23. The positioning pins 22 are guide pins to fit into the positioning holes (not shown in this figure) of the sensor mount plate 15 and to correctly position the sensor jig 14 with respect to the robot wafer gripping portion 5. The sensor cable connector 23 is a connector to which the sensor cable 20 is connected.

Where as the optical axis 10 of the first transmission-type sensor 6 that is fixed to the robot wafer gripping portion 5 is perpendicular to the length axis of the robot wafer gripping portion 5, the optical axis 19 of the second transmission-type sensor 18 that is fixed to the sensing jig 14 is set parallel with the above length axis. That is, the optical axes 10 and 19 are perpendicular to each other. The teaching jig 21 is such that a small-diameter pin 24 erects from the center of the large disc portion 12 that is the same in diameter as the real semiconductor wafer. The large disc portion 12 can be placed at a position of a container or the like where a semiconductor wafer is to be placed. The diameter of the small-diameter pin 24 is about 3 mm. This diameter value is determined so as to provide a sufficient margin with respect to the width 13 mm of: the opening of the second transmission-type sensor 18. Since the relative positional relationship between the large disc portion 12 and the small-diameter pin 24 is measured in advance, the position of the large disc portion 12 can be recognized by recognizing the position of the small-diameter pin 24.

The thickness of the large disc portion 12 is about 2 mm and is greater that that (0.7 mm) of the real semiconductor wafer, and this is relating to the strength. It goes without saying that it is desirable that the thickness of the large disc portion 12 be the same as that of the real semiconductor wafer.

Figure 11:
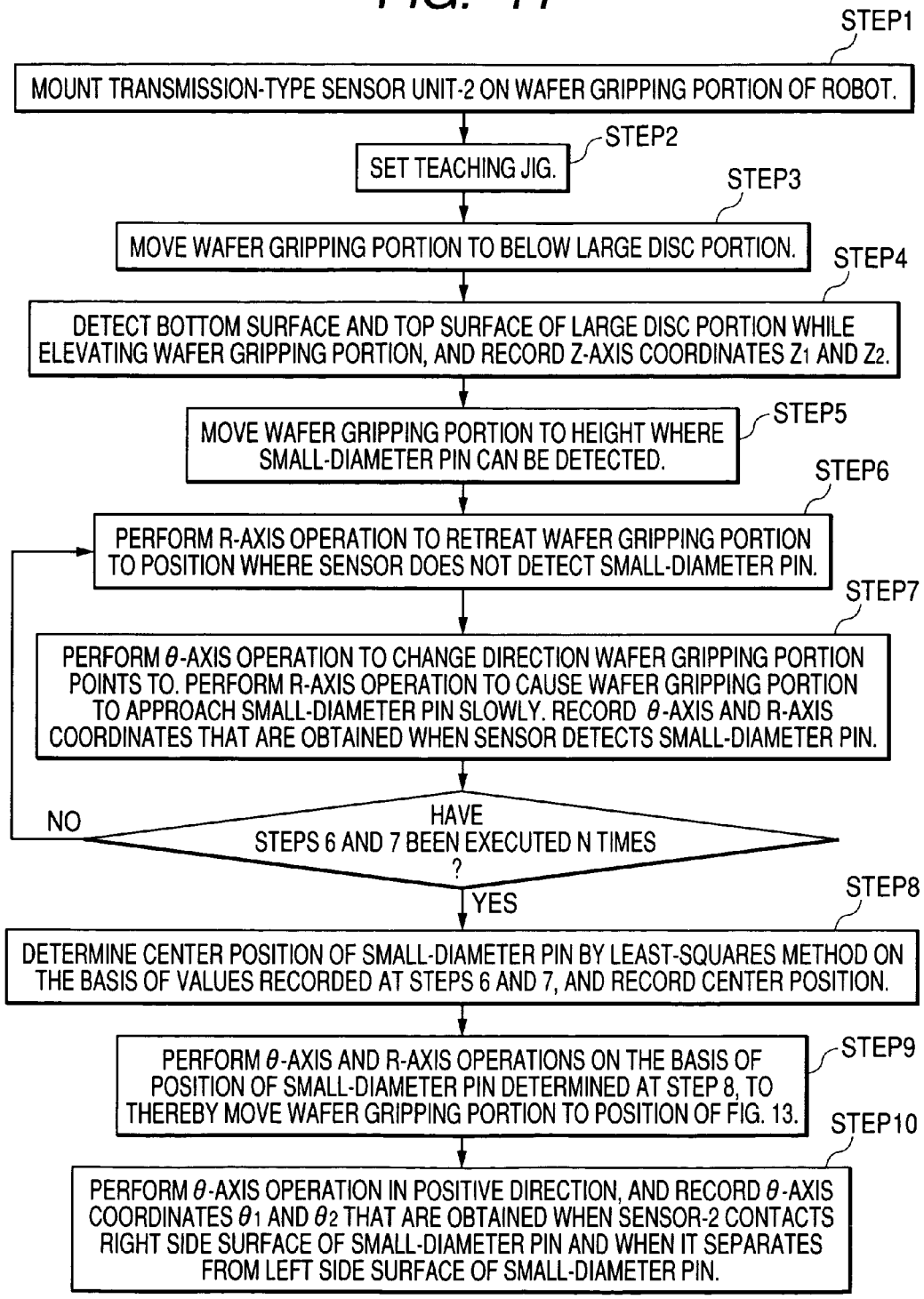
FIG. 11 is a flowchart showing a processing procedure of a wafer position teaching method according to the second embodiment of the invention.

FIG. 11 shows a processing procedure of the wafer position teaching method according to the second embodiment of the invention. This processing procedure will be described below step by step.

(Step 1) The sensor jig 14 is mounted on the wafer gripping portion 5 of the robot in such a manner as to be positioned correctly with respect to each other by using the positioning holes 16 and the positioning pins 22. The sensor cable 20 is connected to the connector 23.

(Step 2) The teaching jig 21 is placed at a position of a container or the like where a semiconductor wafer is to be placed. Since the large disc portion 12 of the teaching jig 21 is completely the same in outer diameter as the real semiconductor wafer, the teaching jig 21 is positioned correctly by positioning guides or the like of the container or the like.

Figure 12:
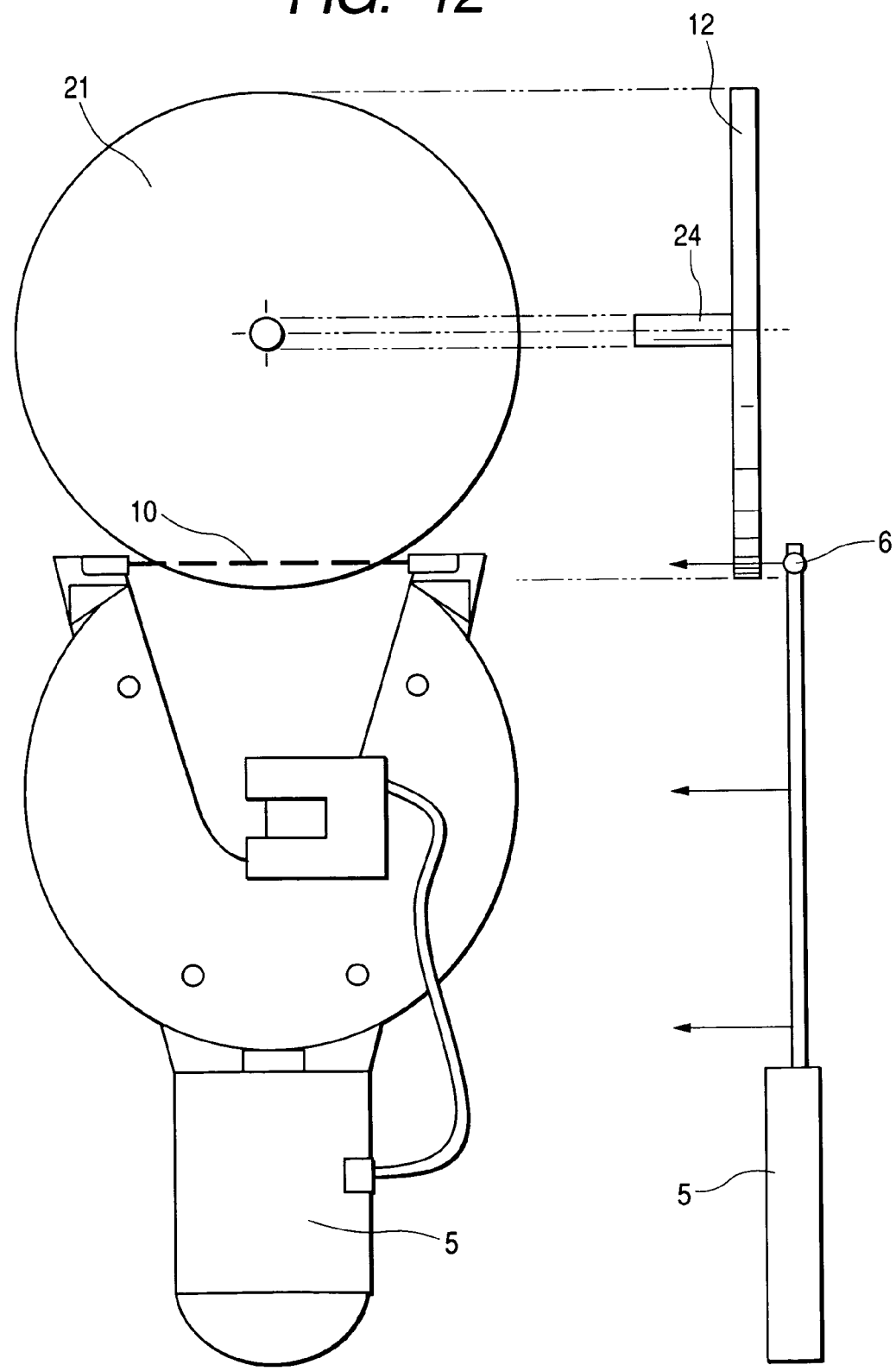
FIGS. 12 and 13 illustrate the wafer position teaching method according to the second embodiment of the invention.

(Step 3) As a result of a manipulation by an operator, as shown in FIG. 12, the wafer gripping portion 5 is moved to below the large disc portion 12.

(Step 4) The wafer gripping portion 5 is elevated, and the bottom surface of the large disc portion 12 is detected by the first transmission-type sensor 6. A Z-axis coordinate $Z_1$ of the robot in this state is recorded. The wafer gripping portion 5 is further elevated, and the top surface of the large disc portion 12 is detected by the first transmission-type sensor 6. A Z-axis coordinate $Z_2$ of the robot in this state is recorded.

(Step 5) The above the large disc portion 12. That is, the wafer gripping portion 5 is moved to a height where the first transmission-type sensor 6 will be able to detect the small-diameter pin 24 when the wafer gripping portion 5 is advanced (here, the advancement is in the positive direction of the R-axis).

(Step 6) The wafer gripping portion 5 is retreated to a position where the first transmission-type sensor 6 does not detect the small-diameter pin 24.

(Step 7) A θ-axis operation is performed so as to change the direction the wafer gripping portion 5 points to. Then, an R-axis operation is performed so that the wafer gripping portion 5 advances and approaches the small-diameter pin 24 slowly. And θ-axis and R-axis coordinates that are obtained when the first transmission-type sensor 6 first detects the small-diameter pin 24 (i.e., the optical axis 10 comes into contact with the circumferential surface of the small-diameter pin 24) are recorded.

(Step 8) Steps 6 and 7 are executed repeatedly. That is, the wafer gripping portion 5 is caused to approach the small-diameter pin 24 in different directions. Plural sets of θ-axis and R-axis coordinates are obtained when the optical axis 10 comes into contact with the circumferential surface of the small-diameter pin 24. The position (θs, Rs) of the center of the small-diameter pin 24 is determined on the basis of these values by the least-squares method and is recorded.

Figure 13:
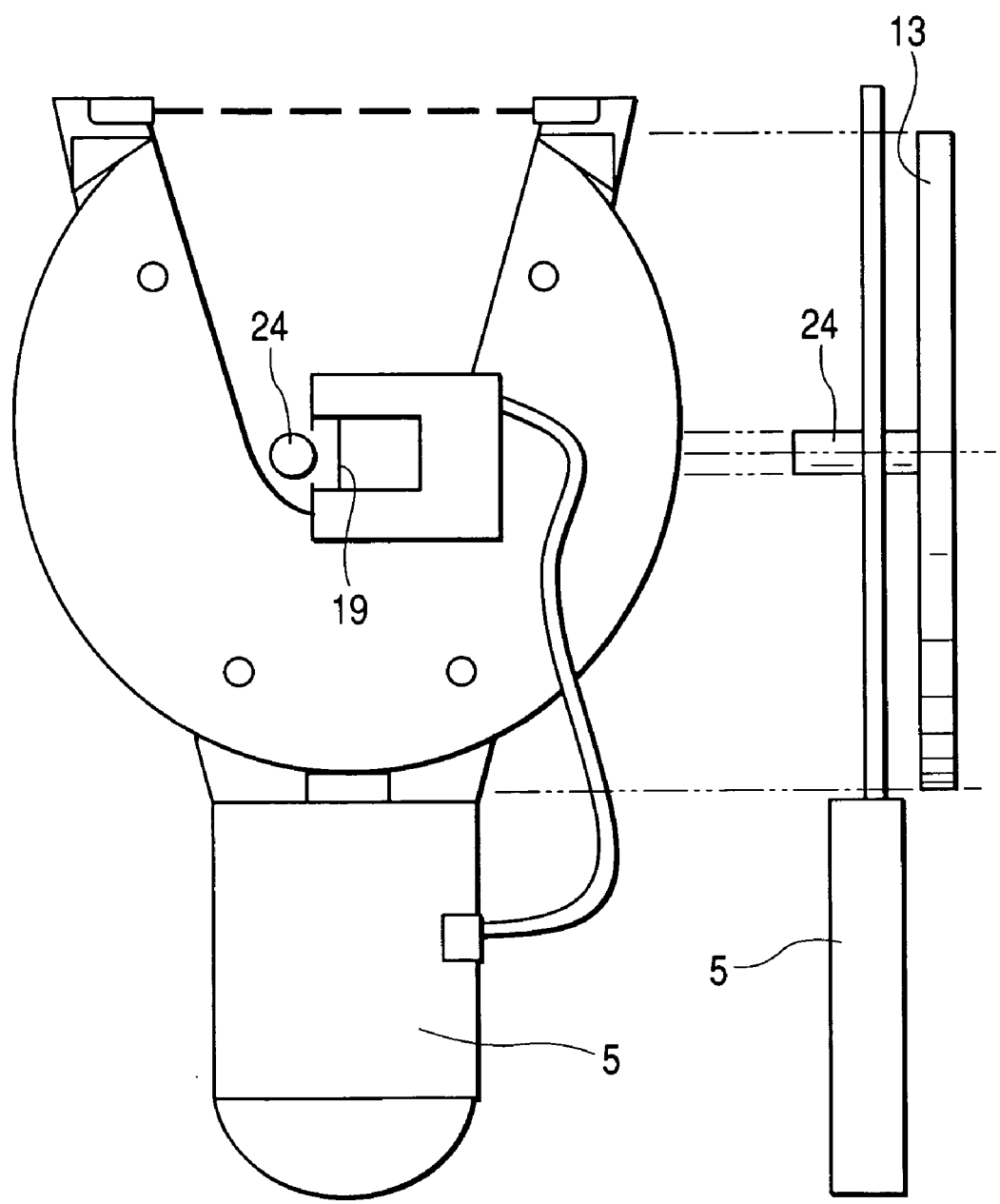

(Step 9) θ-axis and R-axis operations are performed on the basis of the position of the small-diameter pin 24 determined by step 8, whereby the wafer gripping portion 5 is moved to the position shown in FIG. 13. Since the dimensions of the sensor mount plate 15, the sensing cut 17, and the second transmission-type sensor 18 are measured in advance, the wafer gripping portion 5 can be moved to the position shown in FIG. 13 without causing interference with the small-diameter pin 24.

(Step 10) A θ-axis operation is performed, whereby the optical axis 19 of the second transmission-type sensor 18 is caused approach the small-diameter pin 24 slowly. A θ-axis coordinate $\theta_1$ that is obtained when the second transmission-type sensor 18 first detects the small-diameter pin 24 (i.e., the optical axis 19 comes into contact with the right side surface of the small-diameter pin 24) is recorded. Then, a θ-axis coordinate $\theta_2$ that is obtained when the second transmission-type sensor 18 comes not to detect the small-diameter pin 24 (i.e., the optical axis 19 is separated from the left side surface of the small-diameter pin 24) is recorded.

As for the estimate position of the small-diameter pin 24, $(Z_1+Z_2)/2$ that is calculated from $Z_1$ and $Z_2$ that were stored at step 4, Rs that was determined at step 8, and $(\theta_1+\theta_2)/2$ that is calculated from $\theta_1$ and $\theta_2$ that were stored at step 10 are stored as a Z-axis estimate value, an R-axis estimate value, and a θ-axis estimate value, respectively.

The position of the small-diameter pin 24 is determined in the above-described manner. Since the relative positional relationship between the small-diameter pin 24 and the large disc portion 12 is measured in advance, the position of the large disc portion 13, that is, the position of a semiconductor wafer to be mounted on the container or the like, can be determined by shifting the position of the small-diameter pin 24 by a length of the positional relationship.

If the operations of steps 3 to 10 are programmed in advance, the teaching of the position of the semiconductor wafer can be performed automatically without any manipulations by an operator.

The manner of deriving θs and Rs by the least-squares method at step 8 is not described here because it was described in the first embodiment.

In this embodiment, the positioning holes 16 and the positioning pins 22 are used to position the sensor jig 14 with respect to the wafer gripping portion 5 of the robot. However, if the diameter of the sensor mount plate 15 is made the same as that of the semiconductor wafer to be transported, the sensor jig 14 can be positioned automatically by the function of the gripping mechanism of the wafer gripping portion 5 itself. This manner of positioning may be employed. Other means may be employed as long as they can correctly position the sensor jig 14 with respect to the wafer gripping portion 5 of the robot.

As described above, according to the invention of claim 1, the teaching jig is detected by the transmission-type sensor that is attached to the wafer gripping portion. Since a position of a semiconductor wafer can be taught automatically, correct teaching can be attained even if the semiconductor wafer is located at such a position as not be seen directly by an operator. Another advantage is that teaching results of constant quality can be obtained irrespective of the skill of the operator.

According to the invention of claim 2, the position of a semiconductor wafer is taught by detecting the pedestal of a processing apparatus on which the semiconductor wafer is to be mounted. This provides an advantage that the invention can be practiced at a low cost because no special jig is needed.

According to the invention of claim 3, a measurement is performed plural times and a position of the semiconductor wafer is determined by the least-squares method. This provides an advantage that the position of a semiconductor wafer can be taught more accurately.

The teaching jig according to the invention of claim 4 a teaching jig has the large disc portion that is the same in outer diameter as the real semiconductor wafer. This provides an advantage that the teaching jig can correctly be mounted on a container or the like and hence the accuracy of position teaching can be increased.

According to the invention of claim 5, a small-diameter pin is sensed directly. This provides an advantage that the accuracy of position teaching relating to the θ-axis can be increased.

According to the inventions of claims 6 and 7, the second transmission-type sensor is disposed approximately at the center of the semiconductor wafer mounting portion of the robot hand. Therefore, position teaching can be performed in a posture that is close to a posture that is assumed in mounting a wafer actually. This provides an advantage that the accuracy of position teaching relating to the θ-axis can be increased even in the case where the accuracy of relative movement of the robot is low.

According to the invention of claim 8, the optical axis of the second transmission-type sensor can be set approximately perpendicular to the optical axis of the first transmission-type sensor. This provides an advantage that the accuracy of position teaching relating to the θ-axis can be increased According to the invention of claim 9, there is no interference in a horizontal plane between the sensor jig and the small-diameter pin. Therefore, the second transmission-type sensor can be caused to approach the small-diameter pin only by R-axis and θ-axis operations. This provides an ad-vantage that a wafer position can be taught automatically even in a space having only a small margin in the vertical direction (i.e., Z-axis direction).

INDUSTRIAL APPLICABILITY

The invention is useful as a method for teaching the position of a semiconductor wafer to a semiconductor wafer transport robot. The invention also useful as a teaching jig that is used for the above method.

[FIG. 1]
1: ROBOT
2: PROP
3: FIRST ARM
4: SECOND ARM

5: WAFER GRIPPING PORTION
6: TRANSMISSION-TYPE SENSOR
A: θ-AXIS
B: +DIRECTION

[FIG 2]
A: R-AXIS
B: +DIRECTION

[FIG. 3]
A: Z-AXIS
B: +DIRECTION
C: θ-AXIS

[FIG. 4]
6: TRANSMISSION-TYPE SENSOR
8: LIGHT-EMITTING PORTION
9: LIGHT-RECEIVING PORTION

[FIG: 5]
10: OPTICAL AXIS
11: TEACHING JIG
12: LARGE DISC PORTION
13: SMALL DISC PORTION

[FIG. 8]
14: SENSOR JIG
15: SENSOR MOUNT PLATE
16: POSITIONING HOLE
17: SENSING CUT
18: SECOND TRANSMISSION-TYPE SENSOR
20: SENSOR CABLE

[FIG. 10]
21: TEACHING JIG-2
22: POSITIONING PIN
23: SENSOR CABLE CONNECTOR
24: SMALL-DIAMETER PIN

[FIG. 11]
STEP 1: MOUNT TRANSMISSION-TYPE SENSOR UNIT-2 ON WAFER GRIPPING PORTION OF ROBOT.
STEP 2: SET TEACHING JIG.
STEP 3: MOVE WAFER GRIPPING PORTION TO BELOW LARGE DISC PORTION.
STEP 4: DETECT BOTTOM SURFACE AND TOP SURFACE OF SMALL DISC PORTION WHILE ELEVATING WAFER GRIPPING PORTION, AND RECORD Z-AXIS COORDINATES $Z_1$ AND $Z_2$.
STEP 5: MOVE WAFER GRIPPING PORTION TO HEIGHT WHERE SMALL-DIAMETER PIN CAN BE DETECTED.
STEP 6: PERFORM R-AXIS OPERATION TO RETREAT WAFER GRIPPING PORTION TO POSITION WHERE SENSOR DOES NOT DETECT SMALL-DIAMETER PIN.
STEP 7: PERFORM θ-AXIS OPERATION TO CHANGE DIRECTION WAFER GRIPPING PORTION POINTS TO. PERFORM R-AXIS OPERATION TO CAUSE WAFER GRIPPING PORTION TO APPROACH SMALL-DIAMETER PIN SLOWLY. RECORD θ-AXIS AND R-AXIS COORDINATES THAT ARE OBTAINED WHEN SENSOR DETECTS SMALL DISC PORTION.
HAVE STEPS 6 AND 7 BEEN EXECUTED N TIMES?
STEP 8: DETERMINE CENTER POSITION OF SMALL DISC PORTION BY LEAST-SQUARES METHOD ON THE BASIS OF VALUES RECORDED AT STEPS 6 AND 7, AND RECORD CENTER POSITION.
STEP 9: PERFORM θ-AXIS AND R-AXIS OPERATIONS ON THE BASIS OF POSITION OF SMALL DIAMETER PIN DETERMINED AT STEP 8, TO THEREBY MOVE WAFER GRIPPING PORTION TO POSITION OF FIG. 13.
STEP 10: PERFORM θ-AXIS OPERATION IN POSITIVE DIRECTION, AND RECORD θ-AXIS COORDINATES $θ_1$ AND $θ_2$ THAT AE OBTAINED WHEN SENSOR-2 CONTACTS RIGHT SIDE SURFACE OF SMALL-DIAMETER PIN AND WHEN IT SEPARATES FROM LEFT SIDE SURFACE OF SMALL-DIAMETER PIN.

The invention claimed is:

1. A wafer position teaching method for teaching a position of a semiconductor wafer in a container or a processing apparatus to a robot for transporting the semiconductor wafer between the container and the processing apparatus or between processing apparatuses by moving a hand holding the semiconductor wafer in at least three directions of R, θ and Z,
the method comprising the steps of:
placing a first teaching jig at a position to which the semiconductor wafer in the container or the processing apparatus is placed, wherein the teaching jig comprises a large disc portion and a small disc portion connected to each other with the small disc portion overlapping the large disc portion and the large disc portion having a diameter same as a diameter of the semiconductor wafer;
detecting a height of the small disc portion by a first transmission-type sensor provided at tips of the hand by moving the hand in the Z-direction,
detecting the small disc portion by the first transmission-type sensor by moving the hand in the R-direction from plural values of θ; and
calculating a position of the small disc portion on the basis of the detection.

2. The wafer position teaching method according to claim 1, wherein
a least-squares method is applied to results of detection.

3. The wafer position teaching method according to claim 1 wherein
in the step of placing the first teaching jig, the large disc portion and the small disc portion are concentric with each other.

4. A wafer position teaching method for teaching a position of a semiconductor wafer in a container or a processing apparatus to a robot for transporting the semiconductor wafer between the container and the processing apparatus or between processing apparatuses by moving a hand holding the semiconductor wafer in at least three directions of R, θ and Z,
the method comprising the steps of:
placing a sensor jig to which a second transmission-type sensor is fixed to the hand of which tips are provided with the first transmission-type sensor,
placing a second teaching jig at a position to which the semiconductor wafer in the container or the processing apparatus is placed, wherein the second teaching jig comprises a large disc portion having a diameter same as a diameter of the semiconductor wafer and a small diameter pin that erects from a center of the large disc portion,
detecting a height of the large disc portion by the first transmission-type sensor by moving the hand in the Z-direction,
detecting the small-diameter pin by a first transmission-type sensor by moving the hand in the R-direction from a plural values of θ; and
calculating a position of the small-diameter pin on the basis of detection.

5. The wafer position teaching method according to claim 4, wherein in the step of placing the sensor jig, an optical axis of the second transmission-type sensor is disposed approximately at the center of the sensor jig.

6. The wafer position teaching method according to claim 4, wherein in the step of placing the sensor jig, an optical axis of the second transmission-type sensor is set approximately perpendicular to an optical axis of the first transmission-type sensor.

7. The wafer position teaching method according to claim 5, wherein the second transmission-type sensor is disposed approximately at the center of a semiconductor wafer mounting portion of the hand.

8. The wafer position teaching method according to claim 5, wherein an optical axis of the second transmission-type sensor is set approximately perpendicular to an optical axis of the first transmission-type sensor.

9. The wafer position teaching method according to claim 6, wherein the sensor jig is formed with a cut for preventing interference with an optical axis of the first transmission-type sensor.

\* \* \* \* \*